United States Patent [19]
Li

[11] Patent Number: 5,198,371
[45] Date of Patent: Mar. 30, 1993

[54] METHOD OF MAKING SILICON MATERIAL WITH ENHANCED SURFACE MOBILITY BY HYDROGEN ION IMPLANTATION

[75] Inventor: Jianming Li, Beijing, China

[73] Assignee: Biota Corp., Locust Valley, N.Y.

[21] Appl. No.: 587,227

[22] Filed: Sep. 24, 1990

[51] Int. Cl.$^5$ .................................. H01L 21/322
[52] U.S. Cl. ............................. 437/11; 437/24; 437/83; 156/603
[58] Field of Search ............... 437/11, 83, 24; 148/33.1, 33.2; 156/603

[56] References Cited

U.S. PATENT DOCUMENTS

| | | | |
|---|---|---|---|
| 4,509,990 | 4/1985 | Vasudev | 148/1.5 |
| 4,837,172 | 6/1989 | Mizuno et al. | 437/11 |
| 4,885,257 | 12/1989 | Matsushita | 437/11 |

FOREIGN PATENT DOCUMENTS 0162828 12/1981 Japan.
0180028 10/1983 Japan.
0161726 7/1986 Japan.

OTHER PUBLICATIONS

Jianmig Li, "A New Semiconductor Substrate Formation by Hydrogen Ion Implantation into Silicon", Chinese Journal of Semiconductors, vol. 9, No. 4, 1988.

Primary Examiner—Olik Chaudhuri
Assistant Examiner—Ourmazd S. Ojan
Attorney, Agent, or Firm—Michael G. Berkman

[57] ABSTRACT

A new-type silicon material is produced by hydrogen ion implantation and subsequent annealing, the annealing being preferably in two steps. The present invention raises surface mobility of a silicon wafer and produces a buried high-resistivity layer beneath a silicon surface layer. The resulting products are particularly useful for the improvement of yield and speed and radiation hardness of very large scale integrated circuits.

6 Claims, 2 Drawing Sheets

METHOD OF MAKING SILICON MATERIAL WITH ENHANCED SURFACE MOBILITY BY HYDROGEN ION IMPLANTATION

BACKGROUND OF THE INVENTION

The present invention relates generally to semiconductor processing and, more particularly, to processes of forming buried high-resistivity layers and high-quality surface single crystal silicon layers with high electron mobility.

Electron mobility in materials, substrate resistivity, and device size are three factors which affect speed (the speed of integrated circuits). Raising device speed can be achieved by increasing electron mobility in materials, increasing substrate resistivity, and shrinking the device size. For a long period of time, people have been looking forward to finding a new material with high electron mobility, high resistivity substrate, and excellent crystal microstructure in order to manufacture ultra high-speed, very large scale integrated circuits (VLSI).

Czochralski (CZ) silicon is relatively inexpensive and is the best available material with acceptable microstructure. CZ silicon is used worldwide for VLSI manufacturing at present. But mobility in CZ silicon cannot reach its theoretical limit value (i.e., intrinsic mobility) because of the existence of oxygen (about $1 \times 10^{18}$ cm$^{-3}$) and oxygen related defects. Thus, all attempts previously have failed to raise the resistivity of CZ silicon to higher than 100 $\Omega$cm.

Silicon-on-insulator (SOI) technology is reaching the point of actual application to a manufacturable high-speed integrated circuit (IC) in recent years. One of the more successful methods of SOI production is the formation of a buried insulating layer by implantation of oxygen or nitrogen. But, substrates formed by oxygen implantation have the following disadvantages: The damage in the surface region due to oxygen ion bombardment is comparatively serious because the volume of oxygen ion is comparatively large. In other words, oxygen implantation with a dose of above $1 \times 10^{18}$ cm$^{-2}$, that is too high, leads to many defects at the surface region and the surface layer contains some defect-related oxygen precipitates produced during subsequent annealing. And these defects and oxygen precipitates seriously affect the shrinkage of the device size. In addition, the surface mobility in silicon wafers decreases substantially after oxygen implantation and subsequent annealing.

Furthermore, other approaches in the prior art which have attempted to improve SOI substrate by implantation such as, for example nitrogen implantation cause problems similar to oxygen implantation. And even Silicon-on-Sapphire (SOS) substrates in which Si films are grown heteroepitaxially on insulating sapphire substrates (i.e., SOI without implantation), surface silicon layers contain the many defects because of lattice mismatch between Si and Al$_2$O$_3$.

Another kind of important material used to manufacture semiconductor devices is GaAs. The two most favorable properties of GaAs are high electron mobility and semi-insulating substrate which result in high speed of GaAs ICs. Unfortunately, up to now control of crystal microstructure of GaAs material is still difficult and costly.

Many materials for use in manufacturing high-speed ICs have been investigated in the past years. They can be grouped into three main categories: GaAs, CZ silicon, and SOI substrate (including SOS substrate), all of which have serious disadvantages. For GaAs, present technology for controlling crystal microstructure manufacture is expensive. For CZ silicon, electron mobility and resistivity of the substrate are low. For SOI substrate, numerous defects at the surface region results in low electron mobility and poor crystal microstructure.

SUMMARY OF THE INVENTION

Accordingly, it is an object of the invention to make a silicon wafer having a single crystal silicon layer with higher electron mobility compared with original mobility.

It is a further object of the invention to form a high-resistivity buried layer beneath the surface silicon layer.

The invention can be summarized as a method of making a silicon wafer having an improved single crystal silicon layer with improved electronic properties on a defect layer produced by hydrogen ion implantation and subsequent annealing. After hydrogen implantation, the silicon wafer is subjected to a first annealing step to form an interior layer of hydrogen bubbles beneath the surface layer. During another annealing step, the bubble-related defects getter the impurities in the surface layer. As a result, an improved single crystal silicon layer, with higher electron mobility, on a high-resistivity defect-layer is formed. The surface region of a silicon wafer contains fewer impurities after the second annealing step than before implantation. Preferably, rapid thermal annealing (RTA) is utilized during the first annealing step as the means to produce improved single crystal silicon surface layers with the highest electron mobility. The present process overcomes the disadvantages of prior art materials such as GaAs, CZ silicon, and SOI material.

DETAILED DESCRIPTION OF THE PREFERRED EMBODIMENTS

Figure 2:
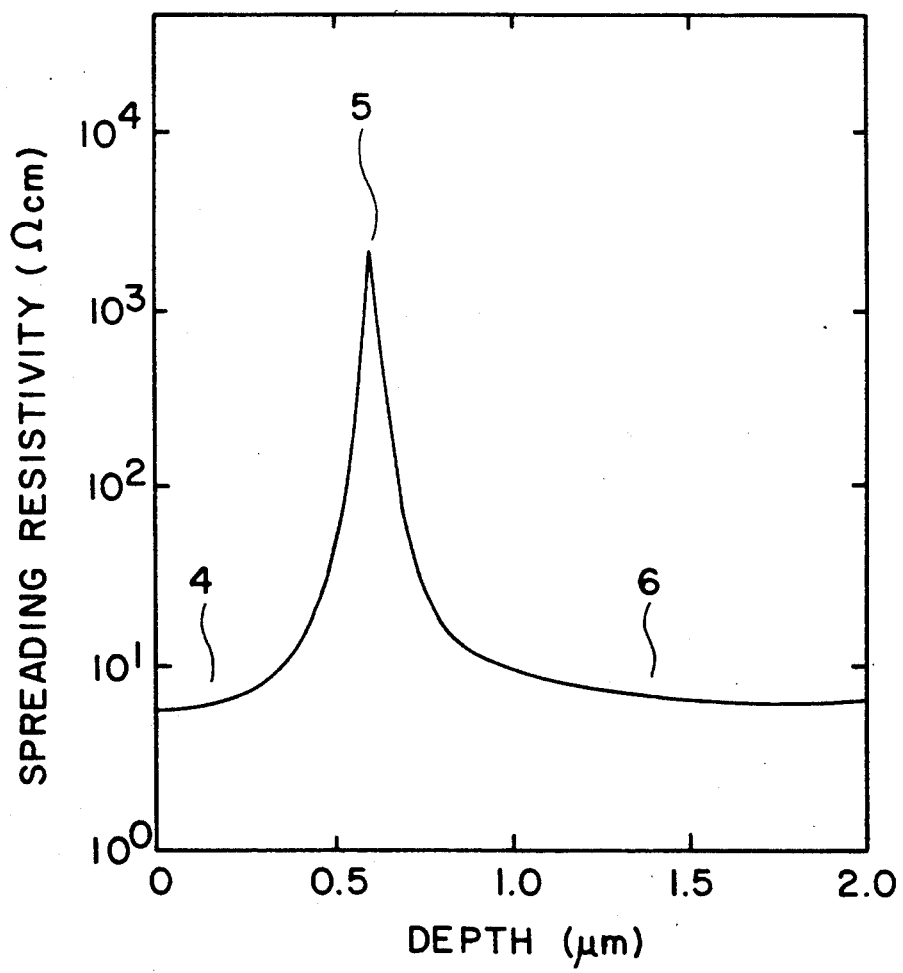
FIG. 2 depicts a depth profile of resistivity in the new-type silicon material for the first embodiment of annealing scheme.

Referring now to FIG. 2, the silicon wafer is implanted with hydrogen ions at 180 keV to a dose of about $2.9 \times 10^{16}$ H$^+$/cm$^2$, and the subsequent annealing conditions are RTA at 900° C. for 10 secs and then conventional furnace annealing at 1180° C. for 20 min. The surface Hall electron mobility in the sample is about 1400 cm$^2$/Vs before implantation and about 1760 cm$^2$/Vs annealing at 1180° C. for 20 min. The surface Hall mobility increases by about 25% as compared with the original mobility. This embodiment applies to a wafer in any orientation.

The method of the invention utilizes hydrogen ion implantation and subsequent annealing to form an improved single crystal silicon surface layer on a high-resistivity defect-layer in a silicon wafer. Silicon wafers are implanted with hydrogen ions, for example, at about 180 keV to a dose of about $2.7 \times 10^{16}$ cm$^{-2}$, although both higher and lower energies and doses may be used. Subsequent annealing conditions are grouped into two embodiments. The first embodiment is as follows: Rapid Thermal Annealing (RTA) and then conventional furnace annealing at high temperature. The second embodiment is as follows: conventional furnace annealing at comparatively low temperature and then conventional furnace annealing at high temperature. In the second embodiment, however, the time of first annealing step for the silicon in (100) orientation at comparatively low temperature is much faster than in (111) orientation. The regrowth rates of implanted amorphous layers for different orientation at comparatively low temperature have been reported by L. Csepregi et al in Appl. Phys. Lett., Vol. 29, p. 92, 1976. During first annealing steps in the two embodiments, damage regions produced by hydrogen ion implantation epitaxially grow on the underlying undamaged single crystal silicon, and many interior hydrogen bubbles are formed beneath surface layer after epitaxy of damage regions. These bubbles cause structural defects around the bubbles. After the last annealing steps, bubble-related defect layers are buried beneath surface layers. These interior bubbles do not move during annealing at high temperature due to their big volume. So the bubble-related defects have very high thermal stability of structure. And, the bubble-related defect layers have very high structural stability and a high resistivity of up to $10^3$ Ωcm or even higher. In addition, the defect layers getter the impurities in the surface layers during last annealing steps at high-temperature, and impurity-related defects in surface layers disappear after gettering. So defect-free (denuded) zones are formed at the surface layers. The removal of the impurities and defects from the surface layer results in an increase of surface Hall mobility. As a result, entirely new-type silicon materials are formed by hydrogen ion implantation and subsequent annealing.

Figure 3A:
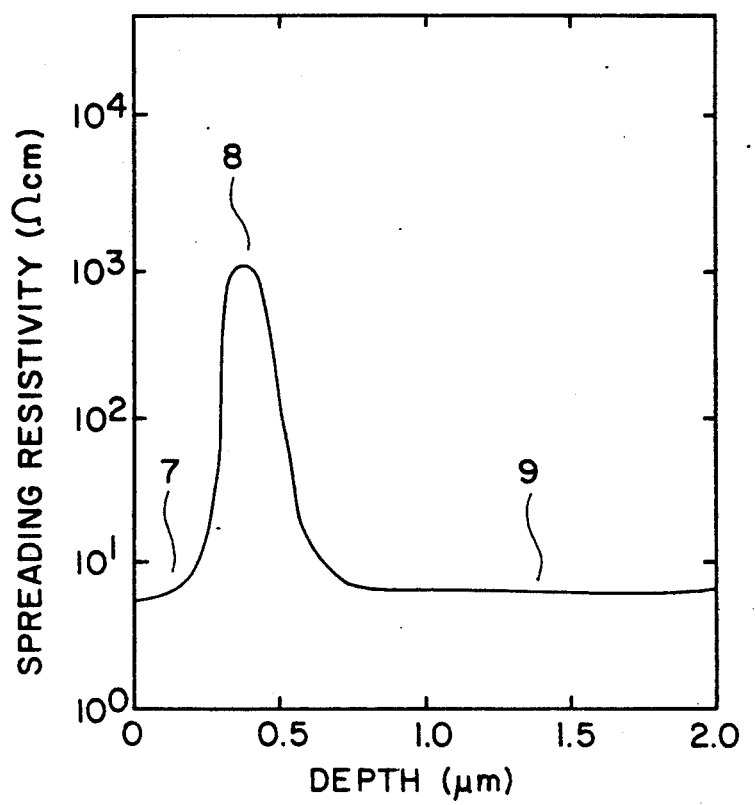
FIG. 3 depicts a depth profile of resistivity in the new-type silicon material for the second embodiment of annealing scheme; and Profiles (a) and (b) correspond to wafers in the orientation of (100) and (111), respectively.
Figure 3B:
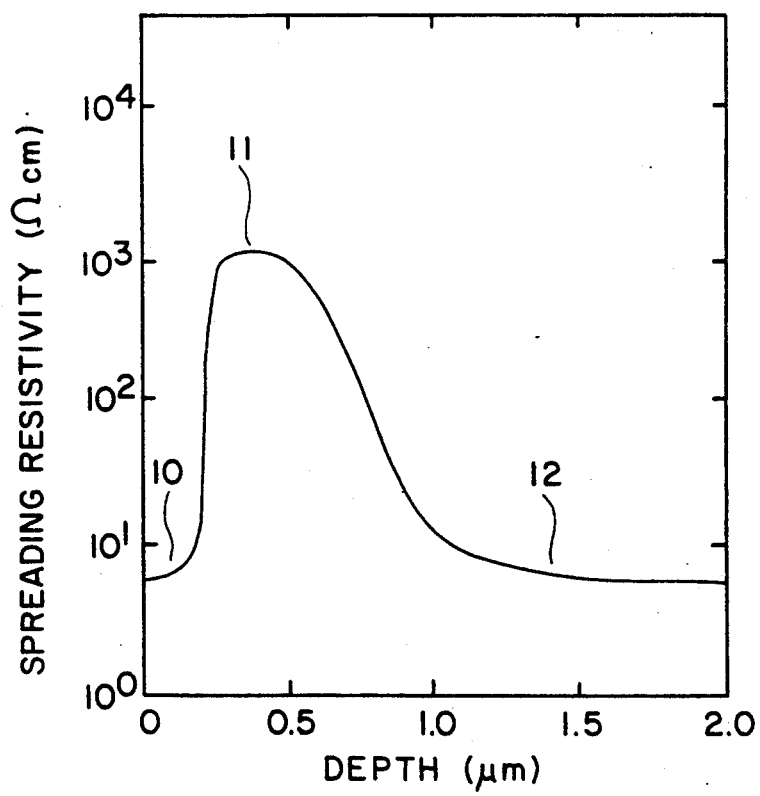

Referring now to FIG. 3, the silicon wafers are implanted with hydrogen ions at 180 keV to the doses of about $2.7 \times 10^{16}$ H+/cm$^2$. For a silicon wafer in (100) orientation, the subsequent annealing conditions are conventional furnace annealing at 600° C. for 20 min and then conventional furnace annealing at 1180° C. for 20 min. For a silicon wafer in (111) orientation, the subsequent annealing conditions are conventional furnace annealing at 600° C. for 10 h and then conventional furnace annealing at 1180° C. for 20 min. Before implantation, the surface Hall electron mobility in the wafers in (100) and (111) orientation is about 1400 cm$^2$/Vs. After annealing at 1180° C. for 20 min, the surface Hall electron mobility is about 1603 cm$^2$/Vs for the wafer in (100) orientation and about 1542 cm$^2$/Vs for the wafer in (111) orientation. The surface Hall electron mobility increases by about 15% for the silicon wafer in (100) orientation and by about 10% for the silicon wafer in (111) orientation.

Figure 1:
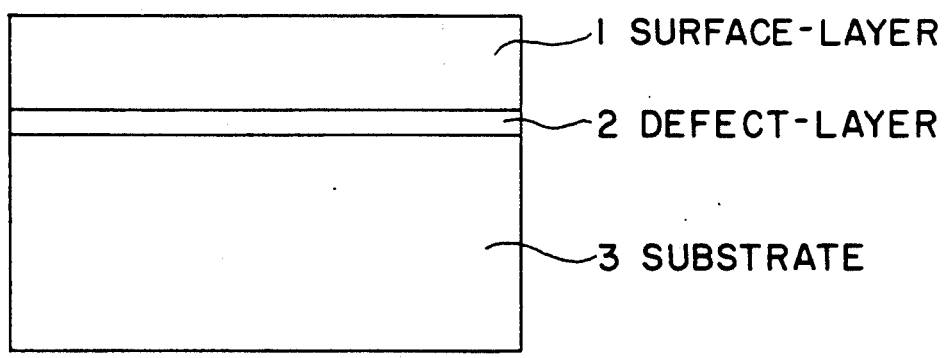
FIG. 1 shows a cross-sectional view of a new-type silicon material according to the invention.

Referring now to FIGS. 1, 2 and 3, the increase of surface Hall electron mobility for the two embodiments shows that surface layer 1 contains much less impurities and defects than before implantation. In addition, the resistivity profile peaks 5, 8 and 11 correspond to the defect-layer 2. FIGS. 2 and 3 show the resistivity of the buried defect layer 2 is up to $10^3$ Ωcm or even higher.

Significantly, I have discovered that other energy sources such as photon energy from a laser may be used for the annealing steps. More advantageously, the wavelength of the laser, such as a well-known CO$_2$ laser or tunable NdYAG laser, can be selected for maximum photon absorption in the irradiated region while minimizing the photon absorption in the unirradiated zone. Also, the time of application of the energy source may be varied within the teachings of the invention to obtain optimum results. For example, the conventional furnace annealing at 1180° C. for 20 mins, described above in connection with FIG. 2, may be advantageously increased to one hour to produce a single crystal silicon layer and a stable defect layer. Tests by x-ray analysis on the Si on defect layer annealed for one hour indicated more perfect single crystal patterns. than that annealed for 20 mins. Furthermore, when devices were fabricated on the Si on defect layer annealed for one hour, the defect layer was found to be stable after undergoing typical VLSI manufacturing process conditions. Thus, annealing time at 1180° C. is preferably one hour or longer in the event a conventional furnace is used, but other times may be selected within the teaching of the invention for other energy sources and other temperatures to provide single crystal silicon on defect layer and to provide stability during subsequent cycling required for manufacturing processing.

Finally, I have discovered that under certain process conditions in VLSI production, my silicon on defect layer may cause wafer warpage due to bending stresses. To overcome this problem, I discovered that by forming a second defect layer by proton implantation through the second surface of the Si wafer using, for example, a dose of protons having similar energy as that described above in connection with FIG. 3 to produce the first defect layer through the front surface region of the Si wafer, and after annealing, I found that the bending stresses caused by the two defect layers cancel each other, thereby causing the wafer to remain planar without warpage which would otherwise interfere with subsequent VLSI manufacturing processing.

I claim:

1. A method of forming a buried high-resistivity layer comprising hydrogen bubbles in a region beneath a surface layer of a silicon wafer having a (100) crystal orientation comprising the steps of:
    implanting a dose of hydrogen ions into said silicon wafer; and
    heating said silicon wafer implanted with hydrogen ions, at a first temperature to form said buried high-resistivity layer comprising hydrogen bubbles.

2. The method recited in claim 1 wherein said hydrogen ions are implanted at a dose of about $2.8 \times 10^{16}$ H+/cm$^2$ with an energy of about 180 keV.

3. The method recited in claim 1 wherein said step of heating includes conventional furnace annealing at about 600° C. for about 20 minutes.

4. The method recited in claim 1 further comprising the step of annealing said surface layer at a second temperature to form single crystal silicon.

5. The method recited in claim 1 wherein said step of heating at said first temperature is carried out for a period of time less than 8 hours.

6. The method recited in claim 4 further comprising the step of fabricating semiconductor devices on said silicon wafer.

* * * * *